United States Patent [19]

Chambers et al.

[11] Patent Number: 5,142,352
[45] Date of Patent: Aug. 25, 1992

[54] CERAMIC PACKAGE COMPONENT HAVING ONE QUARTER WAVELENGTH SPACED CONDUCTIVE GROUNDING VIAS

[75] Inventors: Jeffrey Chambers; David J. Smith, both of Cumbria, England

[73] Assignee: Oxley Developments Company Limited, Cumbria, United Kingdom

[21] Appl. No.: 549,352

[22] Filed: Jul. 6, 1990

[30] Foreign Application Priority Data

Jul. 11, 1989 [GB] United Kingdom ............... 8915827

[51] Int. Cl.⁵ ......................................... H01L 23/14
[52] U.S. Cl. ......................................... 357/74; 357/80
[58] Field of Search ........................... 357/74, 80, 77

[56] References Cited

U.S. PATENT DOCUMENTS

| | | | |
|---|---|---|---|
| 4,551,747 | 11/1985 | Gilbert et al. | 357/74 |
| 4,879,588 | 11/1989 | Ohtsuka et al. | 357/68 |
| 4,881,116 | 11/1989 | Hidada et al. | 357/74 |
| 4,890,155 | 12/1989 | Miyagawa et al. | 357/74 |
| 4,908,694 | 3/1990 | Hidaka et al. | 357/80 |
| 4,922,325 | 5/1990 | Smeltz et al. | 357/74 |
| 5,043,794 | 8/1991 | Tai et al. | 357/74 |

*Primary Examiner*—Rolf Hille
*Assistant Examiner*—S. V. Clark
*Attorney, Agent, or Firm*—Pravel, Gambrell, Hewitt, Kimball & Krieger

[57] ABSTRACT

A ceramic package component has a base portion and an upstanding enclosing wall on the base portion, the upper surface of the wall being provided with an electrically conductive coating in order to receive a lid sealingly thereon. The electrically conductive coating on the upper surface of the wall is electrically connected to a further conductive coating on the undersurface of the base portion by means of a high density array of conductive vias extending through the wall. The inter via spacing between adjacent vias is preferably less than one quarter of the wavelength of the frequency at which the component is to operate.

1 Claim, 1 Drawing Sheet

CERAMIC PACKAGE COMPONENT HAVING ONE QUARTER WAVELENGTH SPACED CONDUCTIVE GROUNDING VIAS

The present invention relates to ceramic package components, for the housing and protection of semiconductor chips, of the type comprising a base portion and an upstanding enclosing wall on the base portion, the upper surface of the wall being provided with an electrically conductive coating in order to receive a lid sealingly thereon.

Hermetic packages provide the necessary environmental protection for semiconductor chips to ensure reliable, long term operation of the chip. At high frequencies, packages fabricated from metals are normally utilized for the inherent grounding of the metal packages wall structure to ensure a good microwave performance. However, the use of ceramic packages is preferred, if they ar able to provide the necessary electromagnetic protection, since a hermetically sealed package can be reliably produced using ceramics.

It is thus an object of the present invention to provide a ceramic package which can be used in electromagnetic environments where previously it has been necessary to use a metal-based package.

The use of conductive vias extending from a die attachment area within the package interior to a conducive area on the base of the package is already known. However, in such known packages, only a small number of such vias, maybe two or three, have been used.

It is also known (EP 260 370) to use conductive vias to connect respective external terminator pins to conductive interconnection layers within the die area. Such vias therefore form part of the internal circuitry of the package.

It has now been discovered that the resonant frequency the package, and hence the frequency at which the package can e operated, can be increased considerably, by electrically connecting said electrically conductive coating on the upper surface of the wall to a further conductive coating on the undersurface of the base portion by means of a high density array of conductive vias extending through the height of the wall.

Preferably, the inner via spacing (d) between adjacent vias in the array should be much less than one quarter of the wavelength at the operating frequency.

In this way, the electrically conductive coating which may be in the form of a metallized layer and which acts as a lid seal is grounded, enabling a ceramic package embodying the aforementioned component to be used in high frequency environments.

The present invention also includes a ceramic package comprising a ceramic package component as hereinbefore defined.

By way of example, only, specific embodiment of the present invention will now be described, with reference to the accompanying drawings, in which.

Figure 1:
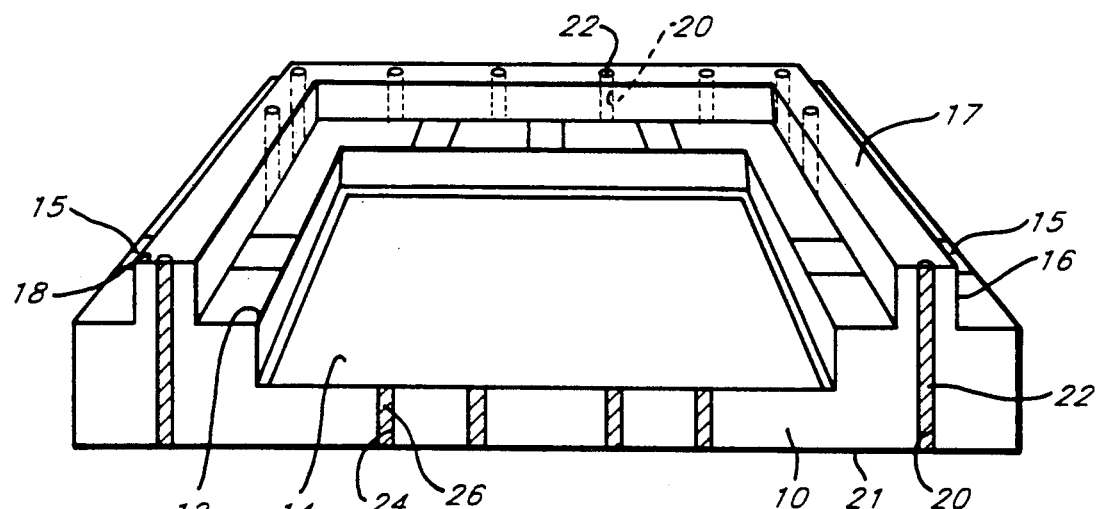
FIG. 1 is a respective view, a partly cut-away, of a first embodiment of ceramic multilayer package component for a semiconductor device, in accordance with the present invention.

Referring firstly to FIG. 1, a multilayer ceramic package component comprises a rectangular base 10 (only the sides of which are shown) which is provided with a central rectangular recess 12 defining a semiconductor die attachment area 14. A rectangular wall 16 (only three sides of which are shown) is located on top of the upstanding portions f the base 10. In use, a semiconductor side is attached onto the die attachment area 14 and a rectangular lid is secured to the upper end of the rectangular wall 16, thereby providing a hermetically sealed multilayer ceramic semiconductor package.

The multilayer ceramic package component is constructed using known tape casting techniques, and various selected layers can be coated with a conductive layer, for example by means of screen printing. For example, 50Ω microstrips 15 extend underneath the wall 16 on the upper surface of the base 10 and also the upper surface 18 of the wall 16 is provided with a metallic coating to enable a good seal with a lid to be obtained.

It will be noted from FIG. 1 that the die attachment area 14 is coated with a conductive metal layer. In accordance with a known technique, a plurality of conduits 24, punched when the component is in the green state and filled with metal to provide conductive vias 26, extend from the die attachment area to the undersurface f the base 10. This feature is particularly use full since the conductive vias 26 rapidly conduct heat away from the die attachment area 14, which allows the ceramic package to be used for both small signal devices and for power devices.

Referring now specifically to the upper surface 18 of the wall, in order to provide a good high frequency performance, especially in the microwave region, ($\geq 18$ GHz) the metallized lid seal must be grounded. This is achieved by punching a plurality of conduits 20 from the top of the wall 16 to the undersurface of the base 10 when the component is till in the green (unsintered) state and then filling the conduits with metal to provide conductive vias 22 extending from the moralization layer 17 on the top of the wall 16 to the moralization layer 21 beneath the base 10. The component is then fired in the normal way. In use, the undersurface of the base 10 will be grounded, thus efficiently grounding the lid seal by virtue of the conductive e vias 22 passing through the wall 16 and the base 10.

Figure 2:
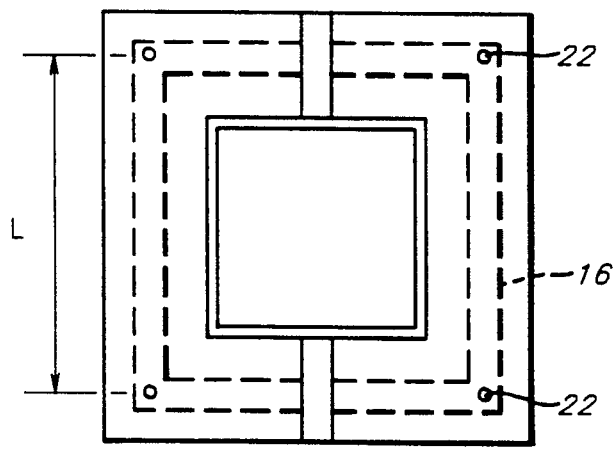
FIG. 2 is a plan view of a second embodiment of ceramic multiplayer package component for a semiconductor device.

In practice, ceramic packages manufactured using co-fired technology normally have an upper frequency limit for electrical grounding purposes, dependent upon the physical dimensions of the package. For example for an embodiment constructed as shown in FIG. 2, (which is otherwise identical to the FIG. 1 embodiment). provided with only four conducive vias 26 extending from the upper surface of the wall 16 to the undersurface of the base 10, one via at each corner of the wall 16, the upper frequency limit of the package is governed by the distance L between adjacent conducting vias 26 becoming equal to an electrical quarter wavelength of the input frequency.

Figure 3:
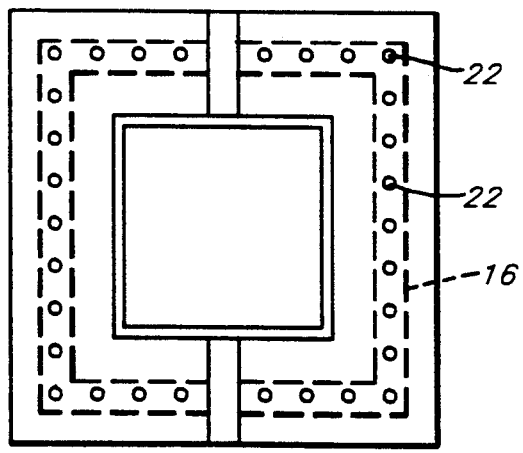
FIG. 3 is a plan view of a third embodiment of ceramic multilayer package component for a semiconductor device, in accordance with the present invention.

In order to overcome the above problem, the spacing of the conductive vias 26 is reduced, as shown in FIG. 3, so that the high density array of vias is provided embodiment.

Thus, in the preferred FIG. 3 embodiment there is a multiplicity of closely spaced vias 22. In order to raise the effective resonant frequency $f_{max}$ of the package the spacing (d) of adjacent vias 22 should preferably satisfy the expression $$d << \lambda/4$$

where $\lambda$ is the wavelength within the dielectric medium of the package corresponding to the opening frequency f ($f_{max} = \lambda_{max}$).

It will be noted also that external metallisation of the package to achieve grounding is not now required.

Moreover, the conduits which are subsequently filled to form the conductive vias may be punched in pairs or higher multiple groups to increase the density of the vias and thereby reduce the inductance of the ground connection even further.

By use of the present invention to provide multiple high density conductive integral vias to ground the package wall structure, it is possible to obtain a co-fired multilayer ceramic package with extended operating frequency into the microwave region (18 GHz and beyond) suitable, for example, for gallium aresnide and high speed silicon integrated circuits.

I claim:

1. In a ceramic package component comprising a base portion and an upstanding enclosing wall on the base portion, the upper surface of the wall being provided with an electrically conductive coating in order to receive a lid sealingly thereon, and said electrically conductive coating on the upper surface of the wall being electrically connected to a further conducive coating on the undersurface of the base portion, the improvement wherein said electrical connection of said electrically conductive coatings on said upper surface of said wall and the undersurface of said base portion is achieved by means of a high density array of conductive vias extending through the height of said wall, the inner via spacing between adjacent vias in the high density array being less than one quarter of the wavelength of the frequency at which said component is to operate.

* * * * *